United States Patent [19]

Skerlos

[11] 4,317,227
[45] Feb. 23, 1982

[54] MULTI-MODE AUTOMATIC CHANNEL FREQUENCY SYNTHESIS SYSTEM

[75] Inventor: Peter C. Skerlos, Arlington Heights, Ill.

[73] Assignee: Zenith Radio Corporation, Glenview, Ill.

[21] Appl. No.: 157,573

[22] Filed: Jun. 9, 1980

[51] Int. Cl.³ .......................... H04B 1/16; H03J 5/00
[52] U.S. Cl. .................................. 455/180; 455/168; 455/188
[58] Field of Search ............... 455/188, 168, 176, 179, 455/180, 189, 191; 334/11, 15; 358/195.1

[56] References Cited

U.S. PATENT DOCUMENTS

| | | |
|---|---|---|
| 3,942,122 | 3/1976 | Nakanishi . |
| 4,002,986 | 1/1977 | Ma .................................. 455/188 |
| 4,015,192 | 3/1977 | Koyanagi ........................ 455/186 |
| 4,118,679 | 10/1978 | Hiday ............................. 455/180 |
| 4,160,213 | 7/1979 | Carter ............................ 455/180 |
| 4,161,708 | 7/1979 | Friberg . |
| 4,249,132 | 2/1981 | Griepentrog .................... 455/191 |
| 4,271,529 | 6/1981 | Strammello, Jr. ................ 455/180 |
| 4,279,035 | 7/1981 | Skerlos ........................... 455/158 |

OTHER PUBLICATIONS

A Microcomputer Controlled Frequency Synthesizer for TV, by Rzeszewski, IEEE Transactions on Consumer Electronics, vol. CE.-24, No. 2, May 1978, pp. 145–152.

Primary Examiner—Tommy P. Chin

[57] ABSTRACT

An all-electronic, integrated television channel tuning indirect frequency synthesis system capable of operating over the VHF, UHF and CATV spectra in which digital bandswitching is accomplished automatically. Keyboard selected control inputs are provided to a microcomputer for the generation of digital bandswitching signals and, in combination with a phase locked loop, tuning voltages. The bandswitch signals and tuning voltages are provided to a tuner having several resonant frequency circuits, each including a varactor diode and a plurality of coupled inductors and switching diodes.

12 Claims, 2 Drawing Figures

MULTI-MODE AUTOMATIC CHANNEL FREQUENCY SYNTHESIS SYSTEM

CROSS REFERENCE TO RELATED APPLICATIONS

This application is related to the following applications all of which are assigned to the assignee of the present application: Ser. No. 107,732, now U.S. Pat. No. 4,280,140, filed Feb. 19, 1980, entitled "Microcomputer-Controlled One-Step-Back Automatic Frequency Control Tuning System," and Ser. No. 107,805, now U.S. Pat. No. 4,279,035, filed Dec. 27, 1979, entitled "Channel Number Entry System," both in the name of Peter C. Skerlos; and Ser. No. 132,348, now U.S. Pat. No. 4,271,529, filed Mar. 20, 1980, entitled "VHF/UHF-/CATV Tuner," in the name of Peter Strammello, Jr.

BACKGROUND OF THE INVENTION

This invention relates generally to multi-band television channel selection, and more particularly relates to automatically generating appropriate bandswitching signals upon channel number selection for tuning a varactor-controlled, resonant frequency, tunable circuit to all VHF, UHF and CATV channels.

Electronic tuners are replacing the more conventional electro-mechanical tuners in current production television receivers at an increasingly high rate because of their improved performance, reduced cost, higher reliability and more appealing user interface characteristics. These electronic tuners typically incorporate several combined tuned circuits the resonant frequency of which is continuously variable by means of a varactor diode having a variable capacitance which varies as a function of an applied DC voltage. The operating frequency of these coupled tuned circuits may thus be adjusted over a given frequency spectrum to permit reception by the television receiver of all signals transmitted therein. However, today there are three separate spectra over which television signals may be received, i.e., the VHF, UHF, and CATV spectra. The VHF television spectrum embraces channels 2–13 covering the frequency range of 57–213 MHz. The UHF spectrum includes channels 14–82 covering the frequency range of 460–910 MHz. The CATV allocated channels are in a so-called Midband consisting of channels A–I (123 MHz. to 171 MHz.) and a so-called Superband consisting of channels J–Z (219 MHz. to 315 MHz.). Recently, these letter-designated channels have also been given numerical designations with channel A–I being channels 83–91 and channels J–Q being channels 92–99. Channel A has been abandoned and it is almost certain that channels R–Z will be reallocated. Thus, there are currently approximately 112 channels available for the transmission of television signals. From the above discussion it can also be seen that these various television channels cover a broad frequency spectrum which has resulted in demanding performance criteria being placed on the design and development of a signal tuner capable of tuning in all currently available television channels.

One difficulty in this area has involved bandswitching to permit the tuned circuits to cover several transmission frequency bands. Providing a VHF and UHF tuning capability in a signal tuner has been accomplished by a number of different approaches. One VHF/UHF tuner control system approach is disclosed in U.S. Pat. No. 3,942,122 to Nakanishi wherein is described a conventional 3-band varactor VHF tuner in which one of the three VHF tuning band circuits is modified to accommodate a UHF IF band generated for tuning to UHF channels. This tuner control system is limited to coverage of only the VHF and UHF bands and involves the use of ten UHF and four VHF potentiometers which reduces system tuning accuracy and severely limits reliability.

Prior art approaches to providing a television receiver with the capability of tuning to VHF, UHF and CATV channels have suffered from various limitations. Typically these attempts involved the use of an accessory known as a frequency converter to provide for the reception of CATV channels. This converter, typically, converts the received CATV signals to a common IF frequency which is generally that of VHF channel number 4. The cable television signals are then applied to a selected channel's position on a conventional VHF tuner. The converter accessory is either incorporated within the tuner housing or supplements the tuner as an additional component located exterior to the television receiver. The need for this converter has resulted in all-channel tuning systems being expensive, unwieldy and overly complex because of the high frequency switching required therein. The presence of this accessory converter also precludes the use of a remote control channel selector over the VHF, UHF and CATV bands.

The basic limitation in prior attempts to develop a single VHF/UHF/CATV channel selection system is related to the capacitance variation in the tuned circuits and the resulting limited frequency spectrum to which these resonant circuits could be tuned. Of course, by increasing the capacitance of the varactor diode in the tuned circuit the frequencies available may be correspondingly increased. However, the internal resistance of the varactor diode increases for higher rated breakdown voltages. Thus, while a greater capacitance-voltage range is obtainable by using diodes of higher voltage breakdown and increasing the tuning voltage, varactor diode internal resistance limits attainable gain in the tuner at the high frequency channels and is, as a result, counter productive. This characteristic of varactor diodes imposes an upper limit on the tuning voltage of approximately 25 volts. While this is a practical voltage range for a VHF band tuner, and even for a combination VHF/UHF tuner, it is not possible to tune to all VHF, UHF and CATV channels within this limited voltage range because signal levels in the tuner are of sufficient magnitude to require inter-channel tuning voltage separation which cannot be accommodated for all channels in these bands within the 25 volt limitation. Despite these limitations, various attempts to provide a multi-band tuner are disclosed in the prior art.

One approach is disclosed in U.S. Pat. No. 4,161,708 to Friberg et al involving the division of the frequency spectrum into different band segments permitting a reduction in the capacitance range required of the varactor diode. By thus reducing the range through which the varactor is required to tune, large impedance variations normally present as the resonant circuit is tuned across the entire reception band are reduced. The frequency ratio of the entire reception band is thus reduced from nearly 3 to 1 to only a ratio of 1.44 to 1 for each of the individual band segments thus produced. While the Friberg approach offers an efficient means to tune over a given RF spectrum, it is specifically intended and designed for radio signal reception, and more specifically for automobile radio reception, and thus would not operate at the higher frequencies of television signals. For example, the Friberg invention is intended to operate over a reception band of 540-1600 KHz, while the VHF, UHF and CATV spectra encompass a frequency range measured in MHz. U.S. Pat. No. 4,002,986 to Ma discloses a system for receiving VHF, UHF and CATV signals involving a plurality of varactor diode tunable stages each having a capacitance range variation as a function of applied tuning voltage which is insufficient to enable the tuner to receive television signals in all three frequencies bands. Consequently, bandswitch means are provided for adjusting the inductive reactances of these tunable stages to permit tuning to more than one television signal in different frequency bands with substantially the same tuning voltage value. This approach suffers from the limitation that a low frequency DC switch must be manually positioned in order to receive either VHF or CATV channels while in the VHF reception mode. Thus, the convenience of multi-band reception simply by selecting a particular channel number is not available.

Still another approach to a multi-band tuner is disclosed in U.S Pat. No. 4,118,679 to Hiday et al which discloses a combination VHF, UHF and Superband tuner which provides automatic bandswitching by activating or deactivating voltage-sensitive switching devices such as switching diodes to produce the desired circuit connections. While this approach does provide the advantages of electronic bandswitching with the automatic generation of bandswitching voltage upon channel number selection, it includes a manual three position (VHF, UHF and Superband) switch with its inherent inconvenience to the user and relatively low reliability mechanical configuration. This band selector switch provides a B+ source of energizing voltage to the appropriate tuner. Finally, mention is made of U.S. Pat. No. 4,015,192 to Koyanagi because it discloses a voltage generation system useful in producing a channel selection voltage for an electronic tuner and which is capable of generating a large range of different voltages to be applied to a varactor diode-type tuner. This invention involves the use of a plurality of variable resistances in parallel which are individually and selectively coupled to and decoupled from the voltage generating circuit by means of switching transistors through which the input control signals are provided to the voltage generating circuit. In this manner, a large variety of resistance values may be incorporated in the circuit to produce a large range of output voltages. While this invention is useful in tuning voltage generation, it fails to offer any bandswitching capability for a varactor-type tuner.

In accordance with the present invention, all of the aforementioned limitations are avoided by means of a single, all-electronic, channel tuning frequency synthesis system capable of operating over the entire VHF, UHF and CATV spectra in which digital bandswitching is accomplished automatically with channel number selection. Digital bandswitching and tuning voltage signals are provided by a microcomputer to bandswitching circuitry and a phase-locked loop, respectively. Appropriate signal level shifting is accomplished between the microcomputer and the tuner to provide proper B+ and bandswitch signals to a varactor-type tuner.

OBJECTS OF THE INVENTION

Accordingly, it is an object of the present invention to provide an improved system for tuning a television receiver to any VHF, UHF or CATV channel.

It is another object of the present invention to provide channel tuning capability for a television receiver over the entire VHF/UHF/CATV spectrum without the need of a frequency band conversion accessory.

Still another object of the present invention is to provide an improved system for tuning a television receiver over the VHF, UHF and CATV bands wherein bandswitching signals are automatically generated and provided to the receiver's tuner.

A still further object of the present invention is to provide a digital electronic, microcomputer-controlled system for synthesizing tuning voltage signals and automatically generating appropriate bandswitch signals in tuning a television receiver over the entire VHF, UHF and CATV Mid- and Superbands.

BRIEF DESCRIPTION OF THE DRAWINGS

The appended claims set forth those novel features believed characteristic of the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
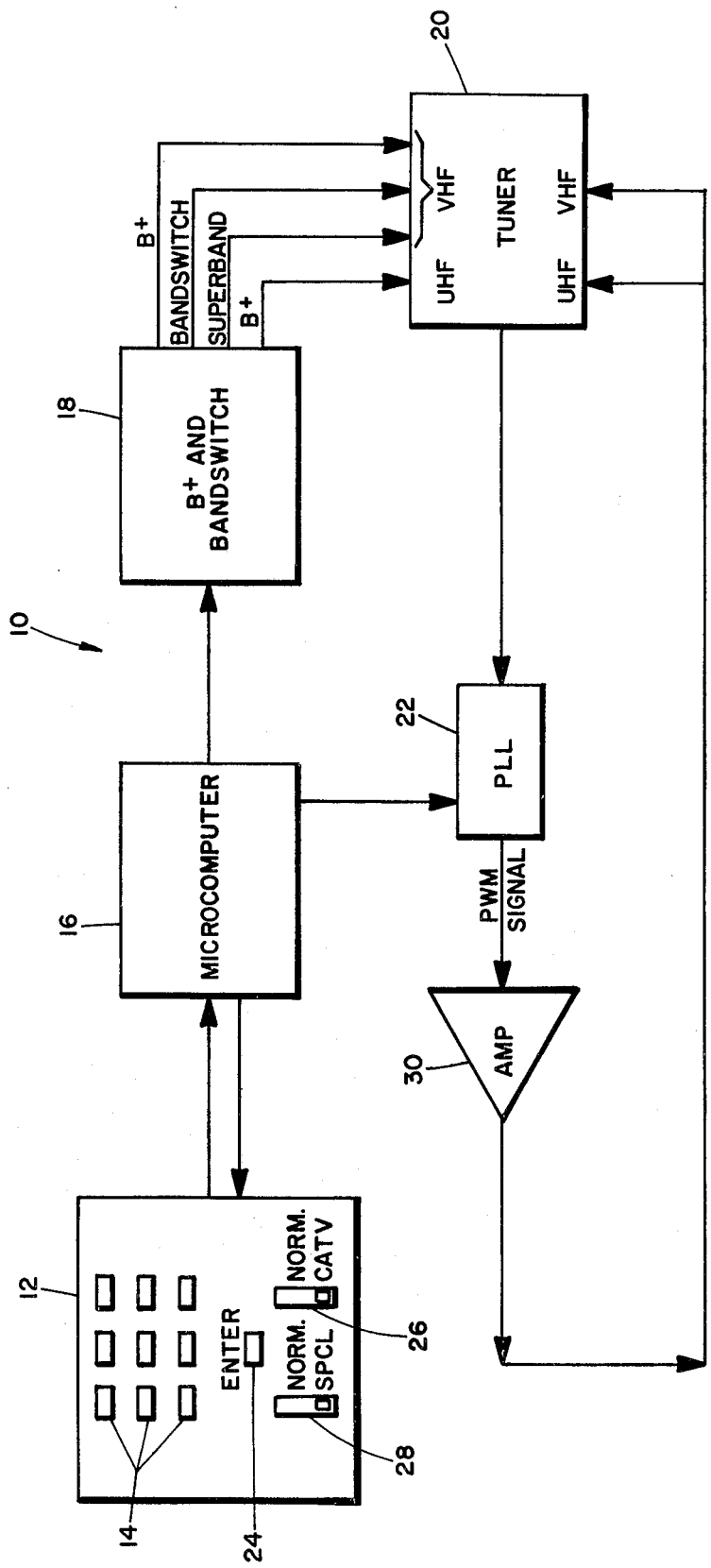
FIG. 1 is a generalized block diagram of a television receiver tuning system incorporating a multi-mode automatic channel frequency synthesis system in accordance with the present invention.
Figure 2:
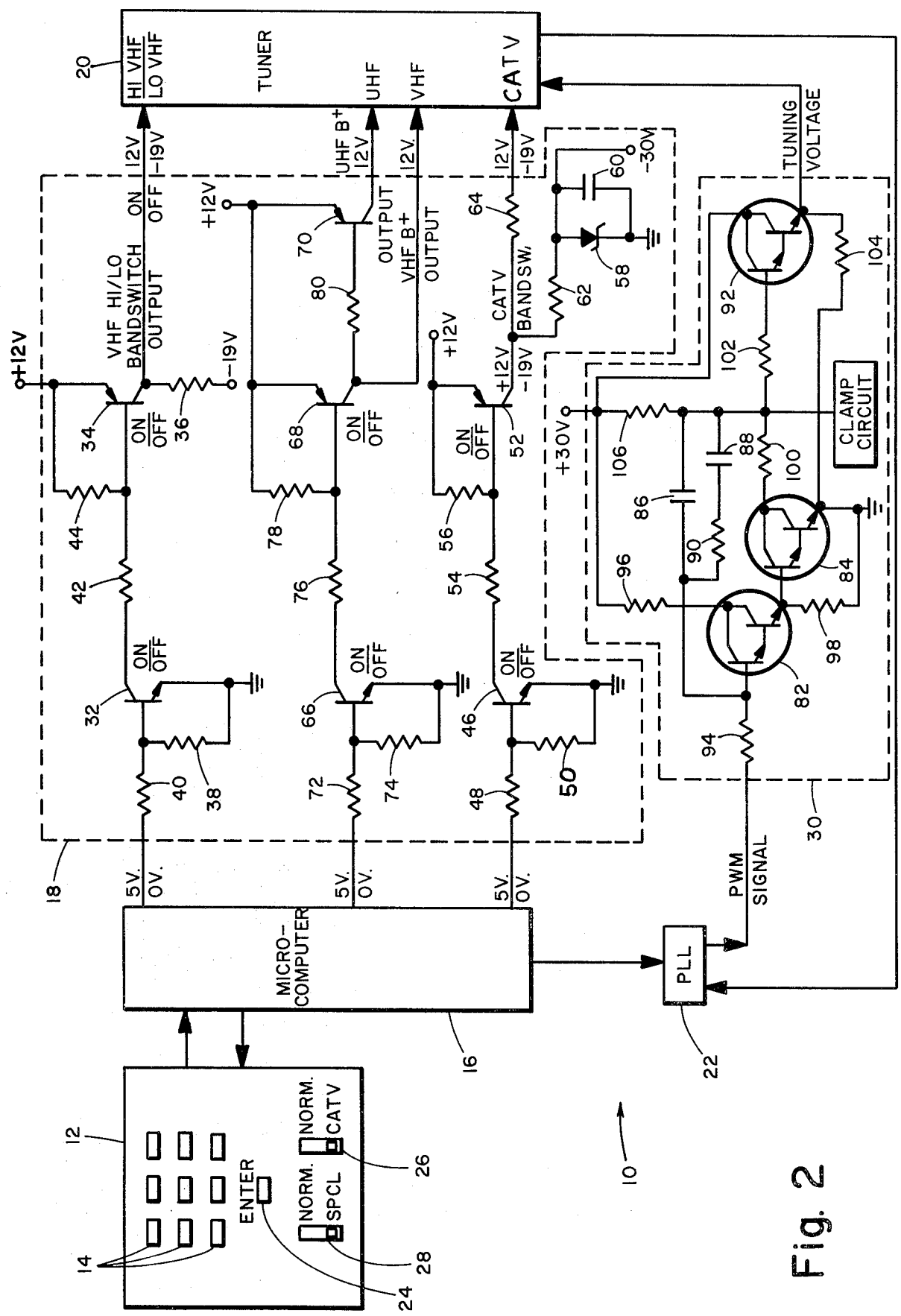
FIG. 2 is a combined block and schematic diagram which shows a multi-mode automatic channel frequency synthesis system for a television receiver in accordance with a preferred embodiment of the present invention.

Referring to the block diagram of FIG. 1, a multi-mode automatic channel frequency synthesis system 10 in accordance with a preferred embodiment of the present invention is shown. Automatic channel frequency synthesis is initiated by means of keyboard 12 or by remote control entry (not shown). Touch pads 14 on the front panel of keyboard 12 and on the remote controller (not shown) provide direct entry of the channel number digits to microcomputer 16. Microcomputer 16 provides information storage, decision making logic and system control. In addition, microcomputer 16 provides ouputs to CATV bandswitch, UHF/VHF B+ switching, and VHF low/high bandswitching circuitry 18. B+ and bandswitch circuitry 18 provides appropriate signal level shifting so as to control VHF/UHF tuner 20 with signals of the correct voltage level. Indirect frequency synthesis is implemented in the multi-mode automatic channel frequency synthesis system 10 by means of phase locked loop (PLL) 22 which receives a local oscillator (not shown) signal from tuner 20 and a signal from microcomputer 16 which represents the selected channel's frequency. The microcomputer-generated signal is provided to a reference oscillator (not shown) in PLL 22 for generating a reference signal which is then phased-compared in PLL 22 to the local oscillator signal of tuner 20. When the reference oscillator signal and local oscillator signal are exactly equal in frequency as measured by a phase comparison, the output of PLL 22 is zero. When there is any difference in the phase, or frequency, between these two signals PLL 22 provides an output which, when passed through PLL amplifier and filtering circuitry 30, provides a correction voltage to tuner 20 to change the local oscillator frequency until the two signals have exactly the same frequency. The local oscillator in tuner 20 then assumes the stability of the crystal reference oscillator in PLL 22. This frequency comparison is done continually in order to compensate for tuner oscillator drift.

By the constant scanning of keyboard 12 by microcomputer 16, binary signals representing contact key closure on keyboard 12 are transmitted to, stored in and processed by microcomputer 16. The matrix of touch pads 14 is periodically scanned by output signals from microcomputer 16 with an appropriate signal returned to microcomputer 16 upon sensing contact key closure. A separate scanning signal is used to sense and detect the closure of "ENTER" key 24. Following channel number selection by means of numbered touch pads 14, the "ENTER" key 24 must be engaged within 4.5 seconds following channel number entry in order to initiate a channel change. If the "ENTER" key 24 is not engaged within 4.5 seconds of channel number selection, the television receiver remains tuned to the currently tuned channel with the digital display (not shown) reverting to the currently tuned channel number.

Microcomputer 16 is a four bit, E/D MOS integrated circuit with a ROM, a RAM, an arithmetic logic unit, input/output (I/O) ports, and a clock generator on a single semiconductor chip. The microcomputer stores data, periodically updates this stored data, compares both stored and real time data and makes decisions based upon these comparisons in providing system control. The microcomputer chip is of the MN 1400 series basic design as manufactured by the Matsushita Electronics Corporation which has been specifically modified for the present application. The RAM has an X-register, Y-register matrix memory organization. The RAM's capacity is 32 by 4 bits with each word stored in a memory storage point consisting of 4 bits. Each bit may be used as a flag to indicate whether a particular event has occurred or the individual bits can be used in combination in the form of a counter. If the CATV switch 26 is positioned in the CATV mode, a bit in RAM corresponding to the CATV memory stores location is set to one by the program in microcomputer 16. The output of the microcomputer's RAM would be such as to indicate that a flag had been set in the appropriate CATV memory storage location in RAM. This BCD word would then be transmitted by microcomputer 16 to phase locked loop 22 thereby initiating the generation of new frequency and tuning information. Detailed information regarding microcomputer 16 can be found in the publication "MN 1400 series: 4-Bit 1-Chip Microcomputer" published by Matsushita Electronics Corporation. Since the manner and details of channel number entry do not form a part of the present invention, only a limited explanation of this process is provided herein. Additional details are included in Applicant's co-pending application entitled "Channel Number Entry System," Ser. No. 107,805, filed Dec. 27, 1979. Implementation of the present invention is not limited to this particular channel number selection and entry system for it could as readily use any conventional channel selection system. Similarly, while one particular microcomputer integrated circuit is described relative to the present invention, it should be obvious that numerous microcomputers having the same general characteristics can be used without departing from the spirit of the present invention.

The two position AFC selector switch control 28 on keyboard 12 enables the user to select between pure phase locked loop operation (normal mode) of AFC operation (special mode) for non-standard signals. In the normal mode, the system puts the tuner's oscillator exactly on the FCC designated frequency. If there is any tuner drift, the system will automatically correct the tuning voltage to compensate for it. The special AFC position is only used for unique situations where the incoming frequency is off from the FCC-designated standard enough to cause noticeable detuning of the picture. As previously discussed, the 2-position band selector switch, or CATV switch, 26 permits the user to elect to receive either UHF channels 14 to 83 or CATV channels "A" through "W" on display channels 14 through 36, respectively.

Tuner 20 is of the superheterodyne type having an RF amplifier and a variable frequency oscillator, the outputs of which are coupled to a mixer which in turn has a frequency selective output circuit to provide an intermediate frequency (or IF) signal which constitutes the tuner's output signal. Typically, a continuously variable tuning voltage output from PLL amplifier 30 coupled to a varactor diode (not shown) in tuner 20 permits the tuned circuits of tuner 20 to be tuned to a particular frequency corresponding to a selected television channel. Also incorporated in tuner 20 are switching diodes (not shown) which are either forward biased or reverse biased by input voltage signals from B+ and bandswitch circuitry 18 which permit various inductive configurations to be switched in or out of tuner 20 thus allowing tuner 20 to accommodate various frequency bands. The precise details of tuner 20 do not form a part of the present inventions and, therefore, will not be described in greater detail. The present invention will interface with and operate with any of the more conventional varactor-type tuners. However, it is to be noted that tuner 20 must be capable of tuning over VHF/UHF/CATV frequency bands and that conventional tuning systems providing this capability typically consist of several tuners in switchable combination each providing access to a particular frequency band. For this reason, in the preferred embodiment of the present invention tuner 20 consists of a single tuner unit capable of tuning to all channels in the VHF/UHF/CATV frequency regimes. A description of a preferred single tuner for incorporation in the present invention is provided in co-pending U.S. patent application Ser. No. 132,348, filed Mar. 20, 1980, entitled "VHF/UHF/CATV Tuner" in the name of Peter Strammello, Jr. The present invention, however, is not limited to operating with the particular tuner described therein but is compatible with any conventional resonant frequency tuner.

Indirect frequency synthesis is utilized in the multimode automatic channel frequency synthesis system 10 in which PLL 22 utilizes the tuner local oscillator (not shown) as its voltage controlled oscillator (VCO). Any of the more conventional indirect frequency synthesis approaches could be utilized in the present invention, however, a brief explanation of how frequency synthesis occurs in the preferred embodiment of the present invention will now be provided. The frequency of a reference crystal oscillator in PLL 22 is divided down and provided to a phase comparator in PLL 22. The other input to the phase comparator is provided by a local oscillator in tuner 20, the frequency of which is appropriately divided down. Microcomputer 16 provides the appropriate input upon channel selection to the reference divider in PLL 22 to get the correct divided down reference oscillator frequency. When the signal from a variable counter (not shown) and the signal from a reference counter (not shown), both of which are in PLL 22, to the phase comparator in PLL 22 are exactly equal, the comparator output is zero. When there is any difference in these two frequencies, the comparator will develop an output which, when passed through the PLL amplifier and filtering circuit 30, provides a correction voltage to varactor tuner 20 to change the local oscillator frequency until the two signals have exactly the same frequency. The local oscillator in tuner 20 then assumes the stability of the crystal reference oscillator in PLL 22. This frequency comparison is done continuously in order to compensate for tuner oscillator drift. The output of the phase comparator in PLL 22 is a series of pulses the duty cycle of which is dependent on the difference between the reference frequency (1 KHz) and the divided down local oscillator frequency. These pulses are filtered by the active PLL filter circuit 30 resulting in a DC voltage with a negligible amount of 1 KHz ripple. No input pulse to PLL amplifier/filter circuit 30 results in a high DC voltage and a high duty cycle pulse output results in a low DC voltage. By means of PLL amplification and filtering circuit 30, therefore, the pulse width modulated output of PLL 22 is converted to an appropriate DC voltage level. This DC voltage signal is then provided to varactor diodes (not shown) in tuner 20 to permit tuning to the selected television channel. Because the operation of PLL 22 and PLL amplification and filtering circuit 30 does not form an essential part of the present invention, since any of the more conventional phase locked loop-indirect frequency synthesis systems could be implemented in the present application, no further discussion of their operation will be provided herein. Additional details regarding the operation of this portion of the present invention are included in Applicant's co-pending U.S. patent application Ser. No. 107,732, filed Feb. 19, 1980, entitled "Microcomputer-Controlled One-Step-Back Automatic Frequency Control Tuning System." In addition, "A Microcomputer Controlled Frequency Synthesizer for TV," IEEE Transactions on Consumer Electronics, Volume CE-24, No. 2, May 19, 1978, by Rzeszewski et al, also includes a detailed description of the characteristics and functioning of a microcomputer, phase locked loop, phase locked loop amplifier and resonant frequency tuner in an unrelated, but general, indirect frequency synthesis application.

In accordance with the present invention, there is shown a detailed schematic and circuit diagram of a multi-mode automatic frequency synthesis system 10 in accordance with a preferred embodiment of the present invention. Digital scanning signals initiated in microcomputer 16 are transmitted to keyboard 12 for sensing the closure of contact key pads 14 and "ENTER" key 24 and the status of AFC switch 28 and CATV switch 26. The keyboard scanning signals are returned to microcomputer 16 which then addresses appropriate memory locations in its ROM in synthesizing B+ and bandswitching signals. The two-level B+ and bandswitching signals are provided to B+ and bandswitching circuitry 18 to provide appropriate DC level signals to tuner 20. Three two-level voltage outputs are provided by microcomputer 16 to B+ and bandswitching circuitry 18 including a VHF Hi/Lo bandswitch output, a CATV bandswitch output, and a VHF/UHF B+ output signal.

In accordance with United Stated transmission standards, the 12 VHF channels are divided into two non-adjacent frequency bands. The first five channels (channels 2–6) fall within the low VHF band which extends from 54 to 88 MHz, while the remaining seven channels (channels 7–13) occupy the high VHF band of 174–216 MHz. Each channel extends over a bandwidth of 6 MHz and channels within each band are uniformly spaced. When a high band VHF channel is selected by means of contact key pads 14 on keyboard 12, microcomputer 16 transmits a positive voltage (+5 V) on the base of VHF Hi/Lo driver transistor 32 causing it to turn ON. The collector of driver transistor 32 is coupled to the base of VHF Hi/Lo switching transistor 34. Coupled to the emitter of switching transistor 34 is a +12 volt source while coupled to its collector is a −19 volt source. With driver transistor 32 turned ON the base of switching transistor 34 is caused to drop below its emitter potential, causing switching transistor 34 to turn ON and to provide +12 V to its collector ouput. When a low band VHF channel is selected (2–6) the microcomputer output to the base of driver transistor 32 is zero. Transistors 32 and 34 remain OFF, producing no B+ output on the collector of switching transistor 34. At this time, the −19 V coupled to the collector of transistor 34 through resistor 36 is applied to the switching diodes (not shown) in tuner 20 to insure that the tunable circuits in tuner 20 possess the correct inductance to tune to VHF low band. The emitter of driver transistor 32 is coupled to ground with resistor 38 providing proper emitter-base biasing for transistor 32 turn on. The 5 V input signal from microcomputer 16 to the base of transistor 32 is reduced to approximately one volt by means of resistor 40. Similarly, resistor 42, which provides the proper voltage level to the base of transistor 34, in combination with emitter-base biasing resistor 44 provides for proper transistor 34 turn-on when microcomputer 16 provides a 5 V output pulse. Thus, a 5 V input pulse to VHF Hi/Lo bandswitch output circuit provided by microcomputer 16 results in a 12 V output signal to VHF tuning circuitry in tuner 20. A zero volt output by microcomputer 16 to VHF Hi/Lo bandswitch output circuit produces a −19 V output signal to VHF tuning circuitry in tuner 20. The 12 volt output signal activates high VHF tuning circuitry while the −19 V output activates low VHF tuning circuitry in tuner 20 in response to selection of either a high-band VHF channel or a low-band VHF channel, respectively.

Similarly, microcomputer 16 provides either a 0 V or 5 V output to the CATV bandswitch circuit. The CATV control signal is provided to the base of transistor 46 and is reduced from 5 V to approximately one volt by resistor 48. The emitter of transistor 46 is connected to ground and proper base-emitter biasing for transistor turn-on is provided by resistor 50. The collector of CATV driver transistor 46 is coupled to the base of CATV switching transistor 52 through resistor 54. The emitter of switching transistor 52 is coupled to a +12 V source while the collector of transistor 52 is coupled to a −19 V source. Emitter-base biasing for transistor 52 is provided by resistor 56 which is coupled from the base of the transistor to the +12 V source. This coupled transistor scheme, similar to that in the VHF Hi/Lo bandswitch circuit, permits transistor 52 to act as a switch which is turned on or off by transistor 46 which, in turn, is turned on by the 5 V output signal from microcomputer 16. A 5 V output signal from microcomputer 16 thus produces a 12 V output signal by CATV bandswitch circuitry to CATV switching diodes in tuner 20 while a zero volt output by microcomputer 16 results in a −19 V signal being provided to CATV bandswitching diodes in tuner 20. In this manner the CATV band is either selected or deselected in tuner 20. In the particular embodiment of the present invention described herein, the CATV bandswitch circuit is coupled to an unregulated −30 V source in the television receiver and it is by means of the Zener diode 58 and capacitor 60 combination coupled to ground that a regulated voltage is applied to the collector of transistor 52. Resistor 62 reduces this regulated voltage to the required −19 V while resistor 64 provides arc suppression to preclude chassis arcing from being fed back to and damaging microcomputer 16.

The VHF/UHF B+ switching circuit is also controlled by microcomputer 16 which provides an output voltage level of either five or zero volts to B+ switching circuitry. The circuit consists of transistor 66, transistor 68 and transistor 70. A VHF/UHF B+ control signal is provided by microcomputer 16 to the base of B+ driver transistor 66 via resistor 72 which reduces the voltage applied to the base of transistor 66. With the emitter of B+ driver transistor 66 connected to ground, base-emitter biasing is provided by resistor 74. Transistor 66 is rendered conducting by a 5 V output signal from microcomputer 16 when a VHF channel is selected. When a UHF channel is selected the output of microcomputer 16 to the base of transistor 66 is zero volts. Thus, B+ driver transistor 66 is rendered conducting when a VHF channel is selected and nonconducting when a UHF channel is selected. The collector of transistor 66 is coupled to the base of transistor 68 via resistor 76. The emitters of transistors 68 and 70 are coupled to a 12 V supply with base-emitter biasing being provided by resistor 78 for transistor 68 and resistor 80 for transistor 70. Thus, either transistor 68 or transistor 70 is rendered conductive depending upon the output of B+ driver transistor 66. Conduction of transistor 66 forces the base voltage on transistor 68 to drop below its emitter potential, causing it to conduct. When transistor 68 conducts, the 12 V B+ source is effectively connected to the VHF portion of tuner 20. The 12 V on the collector of transistor 68, during conduction, is also connected to the base of transistor 70. This insures that transistor 70 does not conduct when VHF channels are selected. For this reason transistor 68 is termed the VHF switching transistor. With a zero volt output from microcomputer 16 B+ driver transistor 66 is rendered nonconducting with VHF switching transistor similarly in a nonconducting state. This permits the voltage required for turn-on to be applied across transistor 70 which is rendered conducting and this results in the coupling of the 12 V B+ source to the UHF portion of tuner 20. Thus, transistor 70 is termed the UHF switching transistor. In this manner, depending on the output signal level of microcomputer 16, either the VHF or UHF resonant circuits in tuner 20 are activated upon the selection of either a VHF or UHF channel.

The tuning voltage is generated and provided to the various tunable stages in tuner 20 in the following manner. The output of the phase comparator in PLL 22 is a series of pulses the duty cycle of which is dependent on the difference between the reference frequency (1 KHz) and the divided-down local oscillator frequency from tuner 20. These pulses are filtered and amplified by the active PLL filter circuit 30 resulting in a DC voltage with a negligible amount of 1 KHz ripple being applied to the varactor diodes in the tunable circuits of tuner 20. PLL 22 provides a pulse width modulated (PWM) signal to PLL filter/amplifier 30. No input pulse results in a high DC voltage being applied to tuner 20 while high duty cycle pulses produce a low DC output voltage from PLL filter/amplifier 30. Once the nominal tuning voltage is established, the circuit acts like a sample and hold circuit and current is either added or subtracted from the base of transistor pair 82 in small quantities only when needed to correct for small frequency errors. The input pulses to PLL amplifier/filter 30 are applied to the base of transistor pair 82 which is a Darlington stage used to maintain an extremely high input impedance. The output at the collector of transistor pair 84, which is coupled to the emitter of transistor pair 82, is fed back to transistor pair 82 via capacitors 86 and 88 and resistor 90. This filtered DC voltage at the collector of transistor pair 84 is then routed through transistor pair 92 which acts as an emitter-follower to provide a low impedance drive to tuner 20. Attached to the base of transistor pair 92 is a clamp circuit which establishes a lower tuning voltage limit below which the output tuning voltage will not go on the high VHF band or Midband CATV. This is done to prevent the tuner oscillator from stalling and ultimately making the system lock-out. The polarity of a phase change of the two signals going into the phase comparator in PLL 22 is such as to correct the tuner's local oscillator so that the output of its countdown is in synchronism with the PLL's reference crystal oscillator. PLL filter/amplifier 30 thus provides adequate filtering of these correction signals so there is no perturbation in the tuning line while allowing a quick response to a new tuning voltage. A 30 V source is applied across PLL filter/amplifier 30 to ground thus permitting a continuous range of channel tuning voltages from 0 to 30 V. Resistors 94 and 96 provide proper biasing for transistor pair 82. Resistors 98 and 100 provide proper biasing for transistor pair 84 and resistors 102, 104 and 106 provide proper biasing for transistor pair 92.

Table I shows the tuning voltage ranges for various tuning frequency bands covering airborne and CATV television signals. Also shown in Table I are the microcomputer output signal voltage levels, either 0 V or 5 V, necessary for bandswitching to the desired frequency sprectrum upon the selection of a given channel number. Microcomputer output signal voltage levels are presented to show the voltage value of the signal provided to each of the VHF Hi/Lo bandswitching, CATV bandswitching, and VHF/UHF B+ switching circuitry for switching to a particular frequency band.

There has thus been shown an all-channel, integrated, single television channel tuning system capable of tuning over the VHF, UHF and CATV frequency bands in which digital bandswitching is accomplished automatically upon the selection of the desired channel number. Bandswitch signals and tuning voltges are provided to a tuner having several resonant frequency circuits, each including a varactor diode and a plurality of coupled inductors and switching diodes. Although the present invention has been described in terms of providing a 112 channel capability, additional channels could be accommodated by this system by merely making adequate provision for additional channel information memory capability and expanding the resonant frequency coverage of the tuner's oscillating circuits. These changes are presently under consideration in view of additional CATV stations soon to be made available.

TABLE I

| MICROCOMPUTER OUTPUT SIGNAL VOLTAGE LEVEL | NORM | | | CATV | | | |
|---|---|---|---|---|---|---|---|
| | Lo VHF | Hi VHF | UHF | Lo VHF | Hi VHF | Mid-Band | Super-Band |
| VHF Lo/Hi Bandswitch | 0V. | 5V. | 5V. | 0V. | 5V. | 5V. | 5V. |
| VHF/UHF B+ Switch | 5V. | 5V. | 0V. | 5V. | 5V. | 5V. | 5V. |
| CATV Bandswitch | 0V. | 0V. | 0V. | 0V. | 0V. | 0V. | 5V. |
| TUNING VOLTAGE RANGE-VOLTS (Approx.) | 1–10 | 11–23 | 1–28 | 1–10 | 11–23 | 3–11 | 8–23 |

While particular embodiments of the invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and accompanied drawings is offered by way of illustration only and not as a limitation. The actual scope of the invention is intended to be defined in the following claims when viewed in their proper perspective against the prior art.

I claim:

1. A system for tuning a television receiver with a single tuner to both airborne and cable television signals over a plurality of frequency bands comprising:

channel selection means for providing a first series of digital signals representative of a selected television channel number;

signal processing means for receiving said first series of digital signals and for generating a second series of digital signals representing the frequency of said selected television channel and the frequency band in which said selected television channel lies;

tuning means having a plurality of tunable stages each including an inductive reactance, a varactor diode exhibiting capacitance variations in response to changes in an applied DC tuning voltage permitting said television receiver to be tuned to all channels in each of said frequency bands, and bandswitch means for adjusting the value of said inductive reactance in said tuning means for enabling said tuning means to be tuned to signals in said plurality of frequency bands, said tuning means possessing a capacitance variation range insufficient, in conjunction with said inductive reactance, to permit said tuning means to be tuned to both airborne and cable television signals;

bandswitch signal generating means responsive to said second series of digital signals representing the frequency band in which said selected television channel lies and coupled to said bandswitch means for adjusting the value of said inductive reactance in said tuning means to permit reception of signals in the frequency band in which said selected television channel lies; and tuning voltage generating means responsive to said second series of digital signals representing the number of said selected television channel and coupled to said varactor diodes in said tuning means for varying the capacitance of said tunable stages to permit said tuning means to be tuned to all television signals in said plurality of frequency bands.

2. The system as recited in claim 1 wherein said channel selection means includes a plurality of digit keys for generating said first series of digital signals representing the number of the selected television channel.

3. The system as recited in claim 1 wherein said channel selection means includes switching means for switching said channel selection means to either a NORMAL mode or a CATV mode, said NORMAL mode allowing said television receiver to be tuned to VHF and UHF channels with said CATV mode allowing said television receiver to be tuned to CATV channels by generating said first series of digital signals representing the appropriate frequency band in which said selected television channel lies.

4. The system as recited in claim 1 wherein said channel selection means comprises:

keyboard means including a plurality of digit keys for generating said first series of digital signals representing the number of the selected television channel; and switching means for switching said channel selection means to either a NORMAL mode or a CATV mode, said NORMAL mode allowing said television receiver to be tuned to VHF and UHF channels with said CATV mode allowing said television receiver to be tuned to CATV channels by generating said first series of digital signals representing the appropriate frequency band in which said selected television channel lies.

5. The system as recited in claim 1 wherein said signal processing means includes a microcomputer comprising:

memory means having a plurality of addresses for storing respective digital codes each identifying a respective channel and frequency band;

addressing means responsive to said first series of digital signals for selectively activating each of said addresses in said memory means to permit the respective channel and frequency band identifying digital code to be read out of said memory means; and signal decoding means for converting said channel and frequency band identifying digital code read out of said memory means to a corresponding second series of digital signals, said second series of digital signals being provided to said bandswitch signal and tuning voltage generating means in tuning said television receiver to the selected television channel.

6. The system as recited in claim 1 wherein said tuning voltage generating means comprises:
a phase locked loop coupled to said signal processing means and to said tuning means for receiving respectively therefrom a signal representing the frequency of said selected channel and a signal from a local oscillator in said tuning means, and for generating a pulse width modulated control signal from a frequency comparison of said signal representing the frequency of said selected channel and said local oscillator signal; and
filtering means coupled to said phase locked loop for receiving said pulse width modulated control signal and for converting said pulse width modulated signal to a level DC tuning voltage signal for transmission to said tuning means in controlling the frequency of said local oscillator.

7. The system as recited in claim 6 wherein said filtering means comprises:
a plurality of coupled Darlington transistor stages for receiving said pulse width modulated signals from said phase locked loop; and
an emitter follower transistor stage coupled to said plurality of coupled Darlington transistor stages to provide a low impedance in transmitting said level DC tuning voltage signal to said tuning means.

8. The system as recited in claim 1 wherein said bandswitch signal generating means comprises:
VHF/UHF B+ voltage switching means responsive to said second series of digital signals from said signal processing means for providing a control signal to said bandswitch means to permit said tuning means to be tuned to signals in either the VHF or UHF broadcast band; and
CATV voltage switching means responsive to said second series of digital signals from said signal processing means for providing a control signal to said bandswitch means to permit said tuning means to be tuned to signals in said CATV band.

9. The system as recited in claim 8 wherein said tuner bandswitch means comprises a plurality of switching diodes for selectively switching coupled inductances in and out of a plurality of tunable circuits in said tuning means to permit reception of signals in a plurality of frequency bands.

10. The system as recited in claim 8 wherein said bandswitch signal generating means further comprises VHF High/Low switching means responsive to said second series of digital signals from said signal processing means for providing a positive voltage or a negative voltage to said tuner bandswitch means when a B+ tuning voltage is provided to said VHF/UHF B+ voltage switching means to permit the reception of VHF channels 2-6 or 7-13, respectively.

11. The system as described in claim 8 wherein said VHF/UHF B+ voltage switching means and said CATV voltage switching means each comprise:
a high voltage source;
a low voltage source;
a switching transistor means coupled between said high and low voltage sources, the output of said switching transistor means being coupled to said tuner bandswitching means; and
driver transistor means coupled between said signal processing means and said switching transistor means such that said switching transistor means is rendered conductive when said second series of digital signals is provided to said driver transistor means resulting in receipt of a high voltage level signal by said tuner bandswitch means and the receipt of a low voltage level signal by said tuner bandswitch means when said switching transistor means is in a nonconducting state.

12. A system for tuning a television receiver with a single tuner to both airborne and cable television signals over a plurality of frequency bands comprising:
channel selection means including:
keyboard means including a plurality of digit keys for generating a first series of digital signals representing the number of a selected television channel; and
switching means for switching said channel selection means to either a NORMAl mode or a CATV mode, said NORMAL mode allowing said television to be tuned to VHF and UHF channels with said CATV mode allowing said television receiver to be tuned to CATV channels by generating said first series of digital signals representing the appropriate frequency band in which said selected television channel lies;
digital signal processing means coupled to said channel selection means for receiving said first series of digital signals, said digital signal processing means including memory means, memory addressing means and signal decoding means for generating a second series of digital signals representing the frequency of said selected television channel and the frequency band in which said selected television channel lies;
tuning means having a plurality of tunable stages each including an inductive reactance, a varactor diode exhibiting capacitance variations in response to changes in an applied DC tuning voltage permitting said television receiver to be tuned to all channels in each of said frequency bands, and bandswitch means for adjusting the values of said inductive reactances in said tuning means for enabling said tuning means to be tuned to signals in said plurality of frequency bands, said tuning means possessing a capacitance variation range insufficient, in conjunction with said inductive reactance, to permit said tuning means to be tuned to both airborne and cable television signals;
bandswitch signal generating means responsive to said second series of digital signals representing the frequency band in which said selected television channel lies and coupled to said bandswitch means for adjusting the values of said inductive reactances in said tuning means to permit reception of signals in the frequency band in which said selected television channel lies, said bandswitch signal generating means including:
VHF/UHF B+ voltage switching means responsive to said second series of digital signals from said signal processing means for providing a control signal to said bandswitch means to permit said tuning means to be tuned to signals in either the VHF or UHF broadcast band; and
CATV voltage switching means responsive to said second series of digital signals from said signal processing means for providing a control signal to said bandswitch means to permit said tuning means to be tuned to signals in said CATV band; and tuning voltage generating means responsive to said second series of digital signals representing the frequency of said selected television channel and coupled to said varactor diodes in said tuning means for varying the capacitance of said tunable stages to permit said tuning means to be tuned to all television signals in said plurality of frequency bands, said tuning voltage generating means including;

a phase locked loop coupled to said signal processing means and to said tuning means for receiving respectively therefrom a signal representing the frequency of said selected channel and a signal from a local oscillator in said tuning means, and for generating a pulse width modulated control signal from a frequency comparison of said signal representing the frequency of said selected channel and said local oscillator signal; and filtering means coupled to said phase locked loop for receiving said pulse width modulated control signal and for converting said pulse width modulated signal to a level DC tuning voltage signal for transmission to said tuning means in controlling the frequency of said local oscillator.

* * * * *

(12) REEXAMINATION CERTIFICATE (4420th)
United States Patent
Skerlos

(10) Number: US 4,317,227 C1
(45) Certificate Issued: Aug. 28, 2001

(54) MULTI-MODE AUTOMATIC CHANNEL FREQUENCY SYNTHESIS SYSTEM

(75) Inventor: Peter C. Skerlos, Arlington Heights, IL (US)

(73) Assignee: Zenith Electronics Corporation

Reexamination Request:
No. 90/004,886, Jan. 2, 1998

Reexamination Certificate for:
Patent No.: 4,317,227
Issued: Feb. 23, 1982
Appl. No.: 06/157,573
Filed: Jun. 9, 1980

(51) Int. Cl.[7] ............................................. H04B 1/16
(52) U.S. Cl. .............................. 455/180.4; 455/168.1; 455/188.2
(58) Field of Search .................. 455/176.1, 179.1, 455/180.1, 188.1, 189.1, 191.1, 168.1; 348/731, 733; 334/11, 15

(56) References Cited

U.S. PATENT DOCUMENTS

| | | |
|---|---|---|
| 3,931,578 * | 1/1976 | Gittinger ........................... 455/188.2 |
| 3,942,122 | 3/1976 | Nakanishi . |
| 3,980,951 | 9/1976 | Breeze et al. . |
| 4,009,439 | 2/1977 | Rast . |
| 4,031,474 | 6/1977 | Ehni, III et al. . |
| 4,078,212 | 3/1978 | Rast . |
| 4,279,035 | 7/1981 | Skerlos . |

FOREIGN PATENT DOCUMENTS 5466704    5/1979  (JP) .

OTHER PUBLICATIONS

Zenith Press Release, "Zenith introduces first color TV sets with microprocessor–based tuning", May 24, 1979.*
Zenith's "L line" product specification sheets, May 1979.*
Zenith's "L line" product meeting minutes, Apr. 1979.*
"A Low Cost Solution to Digital Tuning of Television Receivers and Citizen Band Transceivers", Tickle, Andrew, C., *IEEE Transactions on Consumer Electronics,* pp. 214–219, Aug. 1976.
"Channel–Calculating Logic for TV Tuning System", Hendrickson,, et al., *IEEE Transactions on Consumer Electronics,* pp. 364–380, Aug. 1978.

* cited by examiner

*Primary Examiner*—Edward Urban

(57) ABSTRACT

An all-electronic, integrated television channel tuning indirect frequency synthesis system capable of operating over the VHF, UHF and CATV spectra in which digital bandswitching is accomplished automatically. Keyboard selected control inputs are provided to a microcomputer for the generation of digital bandswitching signals and, in combination with a phase locked loop, tuning voltages. The bandswitch signals and tuning voltages are provided to a tuner having several resonant frequency circuits, each including a varactor diode and a plurality of coupled inductors and switching diodes.

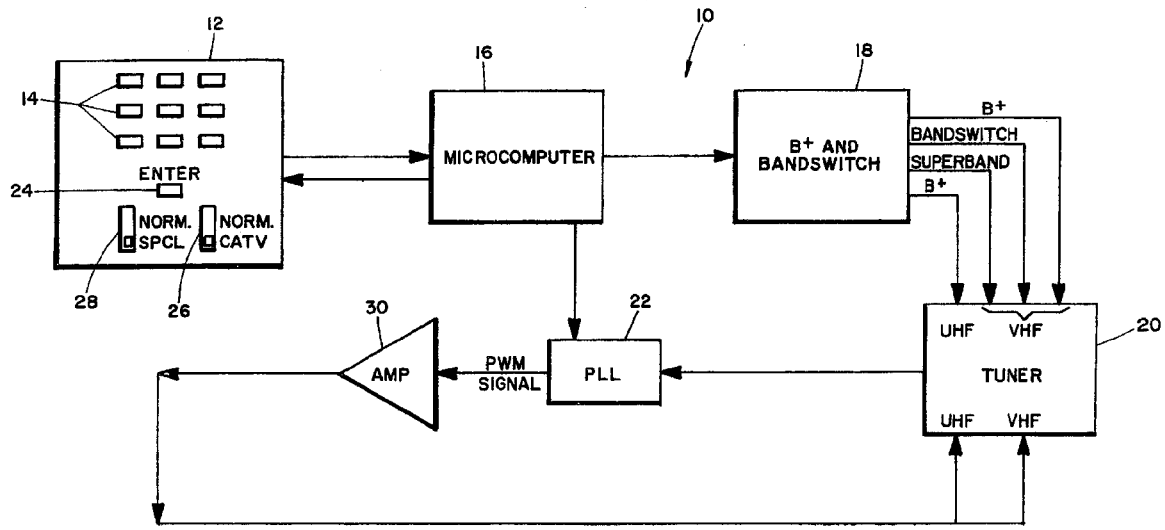

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1, lines 7–13:

This application is [related to the following applications all of which are assigned to the assignee of the present application:] *a continuation-in-part of* Ser. No. 107,732, now U.S. Pat. No. 4,280,140, filed Feb. 19, 1980, entitled "Microcomputer-Controlled One-Step-Back Automatic Frequency Control Tuning System," and *is related to* Ser. No. 107,805, now U.S. Pat. No. 4,279,035, filed Dec. 27, 1979, entitled "Channel Number Entry System," both in the name of Peter C. Skerlos; and *is related to* Ser. No. 132,348, now U.S. Pat. No. 4,271,529, filed Mar. 20, 1980, entitled "VHF/UHF/CATV Tuner," in the name of Peter Strammello, Jr.

AS A RESULT OF REEXAMINATION, IT HAS BEEN DETERMINED THAT:

The patentability of claims 1–12 is confirmed.

* * * * *